United States Patent

Goffing et al.

[11] Patent Number: 6,020,108
[45] Date of Patent: *Feb. 1, 2000

[54] PREPARATION OF PHOTOPOLYMERIC LETTERPRESS PRINTING PLATES

[75] Inventors: Friedrich Goffing, Limburgerhof; Thomas Loerzer, Landau; Hartmut Sandig, Frankenthal; Markus Tönnessen, Mutterstadt, all of Germany

[73] Assignee: BASF Lacke + Farben Aktiengesellschaft, Muenster, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/721,534

[22] Filed: Sep. 26, 1996

[30] Foreign Application Priority Data

Oct. 2, 1995 [DE] Germany .................. 195 36 808

[51] Int. Cl.⁷ .................. G03F 7/095; G03F 7/11
[52] U.S. Cl. .................. 430/306; 430/271.1; 430/273.1; 430/944
[58] Field of Search .................. 430/302, 306, 430/309, 944, 945, 273.1

[56] References Cited

U.S. PATENT DOCUMENTS 5,262,275  11/1993  Fan .................. 430/273

FOREIGN PATENT DOCUMENTS

| | | |
|---|---|---|
| 1 138 | 3/1979 | European Pat. Off. . |
| 59 988 | 9/1982 | European Pat. Off. . |
| 85 472 | 8/1983 | European Pat. Off. . |
| 634 695 | 1/1995 | European Pat. Off. . |
| 720 057 | 7/1996 | European Pat. Off. . |
| 741 330 | 11/1996 | European Pat. Off. . |
| 58052646 | 3/1983 | Japan . |
| WO 94/03838 | 8/1993 | WIPO . |
| WO 94/03839 | 8/1993 | WIPO . |
| 96/16356 | 5/1996 | WIPO . |

OTHER PUBLICATIONS

Ullmann's Ency. of Ind. Chem., vol. A13, p. 629.
Armin Lautert, Allg. Fachkunde der Drucktechnik, S. 42–45, 11. Auflage '93.

*Primary Examiner*—John S. Chu
*Attorney, Agent, or Firm*—Keil & Weinkauf

[57] ABSTRACT

Photopolymeric letterpress printing plates which are to be developed with water or water/alcohol mixtures after imagewise exposure and have, arranged one on top of the other on a dimensionally stable substrate, a layer (A) which may be bonded to the dimensionally stable substrate by an adhesion-promoting layer and is crosslinkable by actinic radiation, a layer (B) which is sensitive to IR radiation and, if required, a parting layer arranged between layer (A) and layer (B), and a peelable protective film applied to the layer (B), are produced by a process in which the layer (A) contains a mixture of at least one polymeric binder which is soluble or dispersible in water or water/alcohol mixtures, copolymerizable ethylenically unsaturated organic compounds which are compatible with the polymeric binder and a photoinitiator, the layer (B) sensitive to IR radiation has an optical density $\geq 2.5$ in the actinic range and contains a film-forming polymeric binder which is soluble or dispersible in water or water/alcohol mixtures and a substance which is finely distributed in this binder and absorbs IR radiation, and the layer (B) sensitive to IR radiation is structured by laser ablation and is then exposed uniformly to actinic radiation, developed and dried in a conventional manner. The novel process is suitable for the production of letterpress printing plates.

6 Claims, No Drawings

PREPARATION OF PHOTOPOLYMERIC LETTERPRESS PRINTING PLATES

The present invention relates to a process for the production of photopolymeric letterpress printing plates which are to be developed with water or water/alcohol mixtures after imagewise exposure and have, arranged one on top of the other on a dimensionally stable substrate, a layer (A) which may be bonded to the dimensionally stable substrate by an adhesion-promoting layer and is crosslinkable by actinic radiation, a layer (B) sensitive to IR radiation, if required a parting layer arranged between layer (A) and layer (B), and a peelable protective film applied to the layer (B), and are suitable for digital information transfer, and letterpress printing plates produced by this process.

Photopolymeric letterpress printing plates which can be developed with water or with an aqueous alcoholic medium consist of a photosensitive photopolymerizable layer which is soluble or dispersible in the developer and is applied to a dimensionally stable substrate, for example polyethylene terephthalate film or steel or aluminum sheet. In order to provide a firm bond, an adhesion-promoting layer may be applied between the photosensitive, photopolymerizable layer which can be developed with water or an aqueous alcoholic medium and the substrate.

A release layer may also be present on the photosensitive, photopolymerizable layer which can be developed with water or an aqueous alcoholic medium, said release layer being required whenever said layer present underneath is so tacky that, when the photographic negative is placed on top, the air present in the vacuum printing frame cannot be uniformly removed and consequently vacuum errors occur during exposure.

The photosensitive, photopolymerizable layer which can be developed with water or an aqueous alcoholic medium can be protected from mechanical damage by a protective film which is present either on said layer or on the release layer present thereon (cf. for example Ullmann's Encyclopedia of Industrial Chemistry, Vol. A 13, page 629).

The information contained in the photographic negative is transferred to this photosensitive, photopolymerizable layer which can be washed out with water or developed with an aqueous alcoholic medium, after removal of the protective film, if present, by application of the photographic negative, removal of the air by means of a vacuum frame and uniform exposure.

In the subsequent development step, the unpolymerized parts can be removed with the aid of water or water/alcohol mixtures; the photopolymerized parts are insoluble or non-dispersible and thus form the relief structure. In order to remove the water or the water/alcohol mixture from the swollen relief layer, a subsequent drying step is effected. Depending on the photosensitive material, the plate may require further processing steps. In the case of some printing plates, for example, uniform postexposure is required in order completely to cure the printing plates.

In this process, the information is thus transferred via a photographic negative. According to the prior art, photographic negatives are produced by exposure of a photosensitive film by means of an exposure unit, for example an optomechanical exposure unit, a CRT (cathode ray tube) exposure unit or a laser exposure unit (He-Ne laser, $\lambda=632$ nm), with subsequent development (cf. for example Armin Lautert, Allgemeine Fachkunde der Drucktechnik, pages 42–45, 11th Edition 1993, Baden-Verlag CH-Baden).

The information transferred in this manner to the film originates from a digitized data set. It would therefore be desirable to be able to produce a letterpress printing plate without the circuitous route via a photographic negative.

In addition to the shorter production times, the costs for the production of a photographic negative would not be incurred. In addition, the wet chemical processes in film development would no longer be required. This would be associated with the ecological advantage that effluents contaminated with chemicals and metal salts would no longer be produced.

Furthermore, the geometric dimensions of a photographic negative may change as a result of temperature and atmospheric humidity, which may lead to register problems of the finished letterpress printing plate since, when a corresponding photo-sensitive, photopolymerizable layer is exposed, the information of the photographic negative is transferred as a 1:1 projection.

According to the prior art, UV exposure is carried out through a photographic negative with application of a vacuum, since intensive contact is required between negative and plate surface in order to avoid side lighting and copying errors.

However, UV exposure without reduced pressure would be desirable, resulting in a crisper copy, i.e. halftone dots would be transferred to the printing plate in smaller size as a result of the inhibitory effect of atmospheric oxygen, so that a smaller increase in tonal value would be achieved during printing.

Digital processes in which no photographic negative is required for information transfer have long been known.

For example, DE 4117127 A1 describes a process in which an image-bearing mask is produced on photosensitive recording elements by using an inkjet printer or an electrophotographic printer. The disadvantage here is that the resolution is insufficient for high-quality halftone letterpress printing.

EP 0001138-A1 describes a process for the production of lithographic printing plates with formation of a fugitive negative.

WO 94/03839 describes a process in which a photosensitive recording element is structured by means of an IR laser and an image-bearing mask is produced in this manner. Here, the photosensitive recording material consists of a substrate, a photosensitive layer, an IR-sensitive layer which is opaque to actinic light and a release layer. On exposure to the IR laser, the exposed parts of the IR-sensitive layer are fixed to the release layer on top and can be removed together with the release layer by peeling off the latter. An image-bearing mask on the photosensitive recording layer is thus obtained. The disadvantage here is that damage, for example scratches, on the release layer, which is simultaneously to serve for mechanical protection, leads to defective information transfer. Furthermore, particularly in the case of fine image sections, there is the danger that surrounding parts intended to remain on the photosensitive recording material may be damaged when the release layer is peeled off, likewise leading to defective information transfer.

U.S. Pat. No. 5,262,275 and WO 94/03838 describe a process in which flexographic printing plates are provided with a digital structure by means of an IR laser. The recording element consists of a substrate, a photosensitive flexographic layer, a barrier layer and an IR-sensitive layer which is opaque to actinic light. The IR-sensitive layer is recorded on directly by means of the IR laser, the IR-sensitive material being evaporated in the parts recorded on and these parts thus becoming transparent to actinic light. The barrier layer present under the IR-sensitive layer on the one hand protects the IR-sensitive layer against diffusion of monomers and other components from the UV-sensitive flexographic layer and prevents the entry of oxygen into the UV-sensitive flexographic layer during UV exposure. As described in WO 94/03838, the UV exposure is not reproducible in the presence of atmospheric oxygen. Moreover, longer exposure times are required in the presence of oxygen. Hence, barrier layers which are not permeable to oxygen are used.

The flexographic printing plates described above are usually used for printing low-viscosity printing inks, which are transferred to the printing plate with the aid of scoop-type rollers or engraved rollers. Steel cylinders are used as impression cylinders. The disadvantage of flexographic printing plates is that these plates cannot be used for printing pasty inks by the traditional letterpress printing method, where the printing plate is inked with the aid of oscillating inking units. Neither can they be used in printing presses having a resilient covering on the impression cylinder.

Letterpress printing makes use of hard, inflexible printing plates which employ pasty inks for printing. A substantial distinction compared with flexographic printing is to be found in the inking unit of the printing press. For letterpress printing in the sense described here, the printing plates are inked with the aid of pasty inks by means of oscillating inking units. In the printing process, the hard letterpress printing plate always operates against an impression cylinder having resilient covering material. Such covering materials of, for example, rubber coverings having a thickness of 5–10 mm or fabric-reinforced rubber blankets having a thickness of 0.5–1.2 mm, which are used together with calibrated cardboard or paper sheets underneath.

Depending on the thickness of the print medium, variations in the covering are necessary in order to keep the total pressure constant. In indirect letterpress printing (letterset, dry offset), the printing plate inks a rubber blanket cylinder, which transfers the printing ink from the printing plate to the print medium. In this process, a steel cylinder is used as the impression cylinder. However, the transfer from the printing plate to the rubber blanket cylinder is still based on the hard/soft principle: hard printing plate (in contrast to flexographic printing) and soft cylinders. Applications are, for example, book printing, (newspapers), printing of continuous forms, printing of tubes, cups and cans, printing of securities, self-adhesive labels, etc.

Flexographic printing inks are low-viscosity printing inks whose viscosity is from 50 to 200 mPas and whose pigment content is usually from 6 to 15%. On the other hand, pasty letterpress printing inks usually have pigment contents of from 20 to 45% and their viscosity is from 100 to 125 Pas. Information about the composition, production and use of printing inks is given, for example, in technical data sheets of Druckfarbenfabriken Gebr. Schmidt GmbH, 1983.

It is an object of the present invention to provide a letterpress printing plate which can be developed with water or an aqueous alcoholic medium, can be provided with digital recordings by means of an IR laser and, in a subsequent step, can be uniformly exposed to UV light with good reproducibility without reduced pressure.

We have found, surprisingly, that this object is achieved by the novel process, a photosensitive recording material which has a certain composition and can be developed with water or an aqueous alcoholic medium overcoming the stated disadvantages.

The present invention relates to a process for the production of photopolymeric letterpress printing plates which are to be developed with water or water/alcohol mixtures after imagewise exposure and have, arranged one on top of the other on a dimensionally stable substrate, a layer (A) which may be bonded to the dimensionally stable substrate by an adhesion-promoting layer and is crosslinkable by actinic radiation, a layer (B) which is sensitive to IR radiation and, if required, a parting layer arranged between layer (A) and layer (B), and a peelable protective film applied to the layer (B), wherein the layer (A) consists of a mixture of at least one polymeric binder which is soluble or dispersible in water or water/alcohol mixtures, copolymerizable ethylenically unsaturated organic compounds which are compatible with this polymeric binder, a photoinitiator or photoinitiator system and, if required, further assistants, the parting layer which may be arranged between layer (A) and layer (B) is oxygen-permeable and the layer (B) sensitive to IR radiation has an optical density $\geq 2.5$ in the actinic range and contains a film-forming polymeric binder which is soluble or dispersible in water or water/alcohol mixtures and at least one substance which is finely distributed in this binder, absorbs IR radiation and has a high absorbence in the wavelength range from 750 to 20,000 nm, the layer (B) sensitive to IR radiation is structured by laser ablation after the protective film has been peeled off and is then exposed uniformly to actinic radiation, developed with water or water/alcohol mixtures and dried in a conventional manner.

The uniform exposure to actinic radiation can preferably be carried out without the use of reduced pressure.

The present invention furthermore relates to letterpress printing plates produced by the novel process.

The novel recording element is very useful for digital information transfer.

Suitable dimensionally stable substrates are those usually used for the production of letterpress printing plates.

Examples of suitable dimensionally stable substrates are plates, sheets and conical and cylindrical sleeves of metals, such as steel, aluminum, copper or nickel, or of plastics, such as polyethylene terephthalate, polybutylene terephthalate, polyamide and polycarbonate, woven fabrics and nonwovens, such as glass fiber fabrics, and composite materials comprising glass fibers and plastics.

Particularly suitable dimensionally stable substrates are dimensionally stable substrate sheets and metal sheets, for example polyethylene or polyester sheets or steel or aluminum sheets. These substrate sheets are generally from 50 to 1100 $\mu$m, preferably from 75 to 400 $\mu$m, for example about 250 $\mu$m, thick.

These substrate sheets may be coated with a thin adhesion-promoting layer, for example a 1–5 $\mu$m thick layer, on that side of the substrate sheet which faces the photosensitive recording layer. This adhesion-promoting layer may consist, for example, of a mixture of a polycarbonate, a phenoxy resin and a polyfunctional isocyanate.

The photostructurable layer (A) may be present on the dimensionally stable substrate, if necessary also by means of an adhesion-promoting layer and an upper coating.

For example, polyurethane adhesive coatings (for example according to DE-A-30 45 516) based on polyisocyanate-crosslinked polyether or polyester coatings may serve as adhesion-promoting layers, in layer thicknesses of from 0.5 to 50 $\mu$m, in particular from 2 to 30 $\mu$m.

Upper coatings may be present on that side of the adhesion-promoting layer which faces away from the substrate, have layer thicknesses of from 0.1 to 50 $\mu$m, in particular from 1 to 10 $\mu$m, and may be obtained, for example, from a dilute aqueous/alcoholic solution of partially hydrolyzed (eg. to an extent of 80 mol %) polyvinyl ester, phenyl glycerol ether monoacrylate and glyoxal, with drying and baking.

The relief-forming layer (A) crosslinkable by actinic radiation, ie. photostructurable, is, according to the invention, a mixture of at least one polymeric binder which is soluble or dispersible in water or water/alcohol mixtures, copolymerizable ethylenically unsaturated organic compounds compatible with this polymeric binder, a photoinitiator or photoinitiator system and, if required, further assistants and additives, such as thermal polymerization inhibitors, plasticizers and/or colorants.

Suitable polymeric binders are those conventionally used for the production of letterpress printing plates, such as completely or partially hydrolyzed polyvinyl esters, for example partially hydrolyzed polyvinyl acetates, polyvinyl alcohol derivatives, eg. partially hydrolyzed vinyl acetate/alkylene oxide graft copolymers, or polyvinyl alcohols subsequently acrylated by a polymer-analogous reaction, as described, for example, in EP-A-0079514, EP-A-0224164 or EP-A-0059988, and mixtures thereof.

Also suitable as polymeric binders are polyamides which are soluble in water or water/alcohol mixtures, as described, for example, in EP-A-00856472 or DE-A-1522444.

In the photostructurable layer (A), these polymer binders account for in general from 50 to 98, preferably from 60 to 95, % by weight of the total amount of the photostructurable layer (A).

Suitable copolymerizable ethyleneically unsaturated organic compounds are those which are compatible with the polymeric binders chosen in each case. In general, these are mono- and/or polyolefinically unsaturated organic compounds which are not gaseous at room temperature, in particular derivatives of acrylic and/or methacrylic acid, such as esters thereof with mono- or polyhydric alcohols, for example acrylates or methacrylates of alcanols of 1 to 20 carbon atoms, such as methyl methacrylate, ethyl acrylate, propyl (meth)acrylate, isopropyl (meth)acrylate, n-butyl (meth)acrylate, isobutyl (meth)acrylate, tert-butyl (meth) acrylate, hexyl (meth)acrylate, cyclohexyl (meth)acrylate, 2-ethylhexyl (meth)acrylate or lauryl (meth)acrylate, (meth) acrylates of polyhydric alcohols of 2 to 20 carbon atoms, eg. 2-hydroxyethyl (meth)acrylate, 2-hydroxypropyl (meth) acrylate, ethylene glycol di(meth)acrylate, polyethylene glycol di(meth)acrylate, butane-1,4-diol di(meth)acrylate, neopentylglycol di(meth)acrylate, 3-methylpentanediol di(meth)acrylate, 1,1,1-trimethylolpropane tri(meth) acrylate, di-, tri- and tetraethylene glycol di(meth)acrylate, tripropylene glycol di(meth)acrylate or pentaerythrityl tetra (meth)acrylate, and poly(ethylene oxide) di(meth)acrylate, ω-methylpoly(ethylene oxide)-yl (meth)acrylate, N,N-diethylaminoethyl acrylate, a reaction product of 1 mol of glycerol, 1 mol of epichlorohydrin and 3 mol of acrylic acid, and glycidyl methacrylate and bisphenol A diglycidyl ether acrylate.

Derivatives of acrylamide and of methacrylamide are also suitable, for example ethers of their N-methylol derivatives with mono- and polyhydric alcohols, eg. ethylene glycol, glycerol, 1,1,1-trimethylolpropane or oligomeric or polymeric ethylene oxide derivatives. These are particularly suitable if polyamides or polyvinyl alcohol are used as binders.

Also suitable are epoxide (meth)acrylates and urethane (meth)acrylates, as can be obtained, for example, by reacting bisphenol A diglycidyl ether with (meth)acrylic acid or by reacting diisocyanates with hydroxyalkyl (meth)acrylates or with hydroxyl-containing polyesters or polyethers. Olefinically unsaturated organic compounds which may furthermore be used are esters of acrylic or methacrylic acid, in particular those having a low vapor pressure and those which are modified with compatibilizers, for example with hydroxyl, amido, sulfoester or sulfonamido groups. Mixtures of the abovementioned copolymerizable ethylenically unsaturated organic compounds may also be used.

Said compounds may be present in the photostructurable layer in amounts of from 1 to 60, preferably from 10 to 45, % by weight, based on the total amount of the photostructurable layer (A).

Suitable photoinitiators or photoinitiator systems are those generally used for photosensitive recording materials, for example free radical photoinitiators, eg. benzoin or benzoin derivatives, such as benzoin ethers of straight-chain or branched monoalcohols of 1 to 6 carbon atoms, eg. benzoin methyl ether, benzoin ethyl ether, benzoin isopropyl ether, benzoin n-butyl ether or benzoin isobutyl ether, symmetrically or asymmetrically substituted benzil acetals, such as benzil dimethyl acetal or benzil 1-methyl 1-ethyl acetal, diarylphosphine oxides, such as 2,4,6-trimethylbenzoyldiphenylphosphine oxide or 2,6-dimethoxybenzoyldiphenylphosphine oxide, ethyl 2,4,6-trimethylbenzoylphenylphosphinate or acyldiarylphosphine oxide according to German Laid-Open Application DOS 2,909,992, diacylphosphine oxides or substituted and unsubstituted quinones, such as ethylanthraquinone, benzanthraquinone, benzophenone or 4,4'-bis (dimethylamino)benzophenone. They may be used alone or as a mixture with one another or in combination with coinitiators, for example ethylanthraquinone with 4,4'-bis (dimethylamino)benzophenone, benzoin methyl ether with triphenylphosphine, diacylphosphine oxides with tertiary amines or acyldiarylphosphine oxides with benzil dimethyl acetal.

The photoinitiators are present in the photostructurable layer usually in amounts of from 0.1 to 10, preferably from 0.5 to 5, % by weight, based on the total amount of the photostructurable layer (A).

In addition to polymeric binders, copolymerizable olefinically unsaturated organic compounds and photoinitiators, the photostructurable layer may contain further assistants and additives. For example from 0.001 to 2% by weight, based on the total amount of the photostructurable layer (A), of thermal polymerization inhibitors which have no significant self-absorption in the actinic range in which the photoinitiator absorbs may be added, eg. 2,6-di-tert-butyl-p-cresol, hydroquinone, p-methoxyphenol, β-naphthol, phenothiazine, pyridine, nitrobenzene, m-dinitrobenzene or chloranil; thiazine dyes, such as Thionine Blue G (C.I. 52025), Methylene Blue B (C.I. 52015) or Toluidine Blue (C.I. 52040); or N-nitrosamines, such as N-nitrosodiphenylamine, or the salts, for example the potassium, calcium or aluminum salts, of N-nitrosocyclohexylhydroxylamine.

Suitable dyes, pigments or photochromic additives may also be added to the novel photostructurable layer (A) in an amount of from 0.0001 to 2% by weight, based on the mixture. They are used for controlling the exposure properties, for identification, for direct monitoring of the exposure result or for aesthetic purposes. A precondition for the choice and the amount of such additives is that they have just as little an adverse effect on the photopolymerization of the mixtures as do the thermal polymerization inhibitors. For example, the soluble phenazinium, phenoxazinium, acridinium and phenothiazinium dyes, such as Neutral Red (C.I. 50040), Safranine T (C.I. 50240), Rhodanil Blue, the salt or amide of Rhodamine D (Basic Violet 10, C.I. 45170), Methylene Blue B (C.I. 52015), Thionine Blue G (C.I. 52025), or Acridine Orange (C.I. 46005), and Solvent Black 3 (C.I. 26150) are suitable. These dyes may also be used together with a sufficient amount of a reducing agent which does not reduce the dye in the absence of actinic light but is capable of reducing the dye in the excited electronic state on exposure. Examples of such mild reducing agents are ascorbic acid, anethole, thiourea, eg. diethylallylthiourea, in particular N-allylthiourea, and hydroxylamine derivatives, in particular salts of N-nitrosocyclohexylhydroxylamine, preferably the potassium, calcium and aluminum salts. As stated, the latter may simultaneously serve as thermal polymerization inhibitors. The reducing agents may be added in general in amounts of from 0.005 to 5% by weight, based on the mixture of the layer (A), the addition of from 3 to 10 times the amount of concomitantly used dye having proven useful in many cases.

The production of the photostructurable layer (A) from the individual components can be carried in the conventional manner by mixing the components with the aid of known mixing methods and by processing this mixture to give the photostructurable layer by means of known techniques, such as casting from solution, calendering or extrusion, and these measures may also be combined with one another in a suitable manner. The thickness of the photostructurable layer is advantageously from about 0.1 to 2 mm, in particular from 200 µm to 1000 µm.

The layer (B) which is sensitive to IR radiation and laser-ablatable and, if required, an intermediate layer comprising an oxygen-permeable developer-soluble or developer-dispersible polymer are present on the photostructurable layer.

Such an intermediate layer is capable of reducing the diffusion of monomers from the photosensitive, photopolymerizable layer into the IR-sensitive layer (B) thereon and of protecting the photosensitive, photopolymerizable layer from the action of the laser beam during the laser ablation. Moreover, this intermediate layer is permeable to atmospheric oxygen so that the UV-exposure following the laser ablation can be carried out without reduced pressure and hence a crisper copy is obtained.

Examples of such water- or water/alcohol-soluble or -dispersible polymers suitable as oxygen-permeable intermediate layers are partially hydroylzed polyvinyl esters, for example partially hydrolyzed polyvinyl acetates, polyvinyl alcohol derivatives, such as partially hydrolyzed vinyl acetate/alkylene oxide graft copolymers, maleic anhydride copolymers, such as copolymers of maleic anhydride and isobutene or maleic anhydride and vinyl methyl ether, water-soluble polyesters, water-soluble polyethers, homo- and copolymers of vinylpyrrolidone, vinylcaprolactam, vinylimidazole, vinyl acetate and acrylamide, water-soluble polyurethanes, polyamides which are soluble in water or water/alcohol mixtures, and mixtures of these polymers.

The layer (B) sensitive to IR radiation consists of one or more water-soluble or water-dispersible or water/alcohol-soluble or -dispersible binders, an IR-absorbing material which is finely distributed in this binder and has strong absorption in the wavelength range from 750 to 20,000 nm, preferably from 750 to 5000 nm, and, if required, a plasticizer. The IR-sensitive layer (B) has an optical density of $\geq 2.5$, preferably from 3 to 5, in relation to actinic light.

Examples of such binders are partially hydrolyzed polyvinyl esters, for example partially hydrolyzed polyvinyl acetates, polyvinyl alcohol derivatives, such as partially hydrolyzed vinyl acetate/alkylene oxide graft copolymers, maleic anhydride copolymers, eg. copolymers of maleic anhydride and isobutene or maleic anhydride and vinyl methyl ether, water-soluble polyesters, water-soluble polyethers, homo- and copolymers of vinylpyrrolidone, vinylcaprolactam, vinylimidazole, vinyl acetate and acrylamide, water-soluble polyurethanes, polyamides which are soluble in water or in water/alcohol mixtures, and mixtures of these polymers.

Dyes and/or pigments may be used as IR-absorbing material. The dyes used may be, for example, phthalocyanines and substituted phthalocyanine derivatives, cyanine and merocyanine dyes and polymethine dyes. For example, carbon black, graphite, chromium oxide and iron oxides may be used as pigments.

The IR-absorbing material is used in a concentration in which it is effective for the novel application. In general, from 1 to 60% by weight, based on the total weight of the layer (B) sensitive to IR radiation are required.

All compounds which absorb UV light may be used for rendering the IR-sensitive layer (B) impermeable to actinic light. Examples are the abovementioned dyes and pigments. Most initiators in photosensitive layers are sensitive to UV light. Carbon black is therefore frequently used as a pigment in the IR-sensitive layer. When carbon black is used as a pigment in the IR-sensitive layer, it is possible to dispense with the use of a further IR-absorbing material. The concentration of the material which is impermeable to actinic light is chosen so that the required optical density is reached. In general, an optical density greater than 2.5 is required. When carbon black is used as the pigment in the IR-sensitive layer, from about 1 to 60, preferably from 10 to 40, % by weight, based on the total weight of the IR-sensitive layer (B), are used.

Water and/or water-miscible organic solvents, for example alcohols, such as methanol, ethanol, isopropanol, n-propanol or tetrahydrofuran, are preferred as solvents for the production of the IR-sensitive layer (B). After combining the components binder, IR-absorbing material and, if required, further assistants, such as plasticizers, surfactants and leveling agents, these are mixed homogeneously with one another in a conventional mixing or dispersing apparatus, such as a stirrer or dissolver. The concentration of the binder and of the IR-absorbing material is from 1 to 80% by weight, based on the total solution. After the solution has been cast on a sheet, for example of polyethylene terephthalate, the resulting thin film is then dried. The dried film generally has a thickness of from 0.5 to 15 µm, preferably from 3 to 10 µm.

The application of the intermediate layer may be effected in a further casting step by casting a dilute solution of the binder of the intermediate layer on the IR-sensitive layer (B) and immediately carrying out drying. The oxygen-permeable layer thus obtained is from about 1 to 10 µm thick. The photostructurable layer (A) can then be applied in a further step.

Another process for the production of the novel layer structure starts from a letter press printing plate which is produced by the procedure described, in which, if necessary, the intermediate layer is applied between the UV-sensitive layer and the protective film. After removal of the protective film, the IR-sensitive layer described above is laminated with the intermediate layer, if necessary with the use of a solvent, such as water or a water/alcohol mixture, and, if necessary, said layers are firmly bonded to one another with the aid of a calender.

It is also possible to apply the intermediate layer to the IR-sensitive layer and to apply the laminate to the letterpress printing plate.

The UV light sources (main emission range from 320 to 400 nm) which are usually used for photopolymer printing plates may be employed for exposing the layer (A) crosslinkable by actinic light, for example flat-plate exposure units equipped with fluorescent tubes (eg. Philips TL 10R 40W or BASF nyloprint 40W BL 366). The 80×107 nyloprint exposure unit is equipped, for example, with 18 high-power UV fluorescent tubes of this type.

Washing out unexposed parts of the photopolymer printing plates, subsequent washing and preliminary drying can be carried out with the commercial washout systems suitable for this purpose. For example, the nyloprint washout system DW85 operates according to the washout principle employing a brush washer. Drying can then be effected in continuous dryers, for example in a nyloprint DT85 continuous dryer.

The combination of washout system with continuous dryer is denoted by the nyloprint DW/DT85 continuous unit.

In the Examples and Comparative Examples which follow, parts and percentages are by weight, unless stated otherwise.

The production of a novel, photosensitive recording element is described in Examples 1 and 2.

EXAMPLE 1

A water-soluble IR-sensitive layer (B) was produced by dissolving 2 parts of carbon black (eg. Printex® U from Degussa) and 6 parts of a polyvinyl alcohol (eg. Mowiol® 5-72 from Hoechst) in 80 parts of water and 20 parts of n-propanol. n-Propanol is used as leveling agent in order to achieve good wetting during casting of this solution on a polyethylene terephthalate film. After combination of the components, these were treated in a disperser (Ultra Turrax) for 2 hours in order to prepare a finely divided dispersion. The dispersion thus obtained was cast on a polyethylene terephthalate sheet (125 µm Mylar® from DuPont), this being done in such a way that the resulting film had a layer thickness of 7 µm and an optical density of 4.5 after drying.

This layer is laminated with water-developable commercial letterpress printing plate on a film base, e.g. nyloprint®WFH III 80 (=layer (A) on substrate) (manufacturer BASF AG) with the use of an 18:1 propanol/water mixture, after the protective film had been removed from this plate.

After the protective film had been peeled off, this photosensitive recording material was mounted on a vacuum drum and exposed by means of an Nd-YAG laser (wavelength 1064 nm). The spot diameter of the IR beam was adjusted to 20 µm. This was an exposure unit from Baasel-Scheel. Thereafter, the plate was exposed uniformly to UV light of wavelength 320–400 nm without reduced pressure in an 80×107 nyloprint® exposure unit and was washed out with water in a continuous washout and drying unit (e.g. nyloprint DW/DT 85), dried at 60° C. and postexposed. A printing plate having a very small increase in tonal value in the print was obtained.

EXAMPLE 2

A water-soluble IR-sensitive layer was produced by dissolving 2 parts of carbon black (Printex U from Degussa) and 8 parts of a partially hydrolyzed polyvinyl alcohol (eg. KP 205 from Kuraray) in 80 parts of water and 20 parts of n-propanol. After combination of the components, these were treated in a disperser (Ultra Turrax) for 2 hours in order to prepare a finely divided dispersion. The dispersion thus obtained was cast on a polyethylene terephthalate sheet (125 µm thick; eg. Lumirror® X 43 from Toray Ind.), this being done in such a way that the resulting film had a layer thickness of 8 µm and an optical density of 4.5 after drying. Thereafter, an oxygen-permeable layer was applied to the IR-sensitive layer, said oxygen-permeable layer being prepared from 40 parts of water and 2 parts of a partially hydrolyzed polyvinyl alcohol (Mowiol 4-80 from Hoechst AG), cast on the IR-sensitive layer and immediately dried, this being done in such a way that the dried oxygen-permeable layer had a thickness of 5 µm.

This laminate was laminated with a commercial water-developable letterpress printing plate on steel substrate, eg. nyloprint® WS II 73 (from BASF AG), with the use of a 9:1 n-propanol/water mixture as a laminating solvent, after the protective film had been removed from this plate.

After the protective film had been peeled off, this photosensitive recording material was mounted on a vacuum drum and exposed by means of an Nd-YAG laser (wavelength 1064 nm). The spot diameter of the IR beam was adjusted to 20 µm. This was an exposure unit from Baasel-Scheel. Thereafter, the plate was exposed uniformly to UV light without reduced pressure in an 80×107 nyloprint® exposure unit and was washed out with water in a continuous nyloprint DW/DT 85 unit, dried at 80° C. and postexposed. A printing plate having a very small increase in tonal value in the print was obtained.

Comparative Example 1

A water-developable letterpress printing plate (eg. nyloprint® WFH III 80 from BASF AG) was, in contrast to Example 1, uniformly exposed in a vacuum frame to UV light through a negative and not through the mask produced by laser ablation of the IR-sensitive layer. Both the negative and the mask were produced from the same digital data set; the geometrical dimensions of the image sections permeable to actinic light were thus absolutely identical in both processes. After the subsequent development steps (washout, drying, postexposure), the finished printing plate was mounted on a printing press and proofs were printed. A substantially bolder print, i.e. a substantial increase in tonal value, was obtained.

Comparative Example 2

The IR-sensitive layer was produced as described in Example 1, paragraph 1. Thereafter, an oxygen-impermeable layer was applied to the IR-sensitive layer, said oxygen-impermeable layer being produced from 40 parts of water and 2 parts of a completely hydrolyzed polyvinyl alcohol (Mowiol 66-100 from Hoechst AG), cast on the IR-sensitive layer and immediately dried, this being done in such a way that the dried oxygen-impermeable layer had a thickness of 5 µm.

This laminate was laminated with a nyloprint® WS II (from BASF AG) with the use of an 18:1 n-propanol/water mixture, after the protective film had been removed from this plate.

This photosensitive recording material produced in this manner was mounted on a vacuum drum after the protective film had been peeled off and was exposed by means of an Nd-YAG laser (wavelength 1064 nm). The spot diameter of the IR beam was adjusted to 20 µm. An exposure unit from Baasel-Scheel was used. Thereafter, the plate was exposed uniformly to UV light in an 80×107 nyloprint exposure unit without reduced pressure and was washed out with water in a nyloprint DW/DT 85 continuous unit, dried at 60° C. and postexposed. A printing plate having a bold, low-contrast print and a pronounced increase in tonal value was obtained. The plate did not meet the requirements for a letterpress printing plate.

We claim:

1. A process for the production of a photopolymeric letterpress printing plate, wherein said process comprises arranging one on top of the other on a dimensionally stable substrate having a thickness of from 50 to 1100 µm:

a layer (A) consisting essentially of a mixture of at least one polymeric binder; said binder being soluble or dispersible in water of a water/alcohol mixture, or in a copolymerizable ethylenically unsaturated organic compound which is compatible with the polymeric binder and a photoinitiator or photoinitiator system; said layer (A) being cross-linkable by actinic radiation;

a layer (B) comprising a film-forming polymeric binder; said binder being soluble or dispersible in water or a water/alcohol mixture; said binder comprising at least one substance which is finely distributed in the binder; said layer (B) being sensitive to IR radiation and having a high absorbence to IR radiation in the wavelength range of from 750 to 20,000 nm; said layer (B) having a peelable protective film applied to one of its surfaces; said layer (B) having an optical density $\geq 2.5$ in the actinic range; and then arranging a parting layer between layer (A) and layer (B); said parting layer being permeable to oxygen; and then removing the protective film from layer (B); structuring the layer (B) by laser ablation; exposing the structured layer (B) uniformly to actinic radiation; developing the exposed layer (B) with water or a water/alcohol mixture; and then drying the plate.

2. The process defined in claim 1, wherein the layer (A) is bonded to the dimensionally stable substrate by an adhesion-promoting layer.

3. The process of claim 1, wherein the uniform exposure to actinic radiation is carried out without application of reduced pressure.

4. A photopolymeric letterpress printing plate produced by the process of claim 1.

5. A process for the production of photopolymeric letterpress printing plates as defined in claim 1, wherein the dimensionally stable substrate has a thickness of from 75 to 400 µm.

6. A process for the production of photopolymeric letterpress printing plates as defined in claim 1, wherein the dimensionally stable substrate has a thickness of about 250 µm.

* * * * *